United States Patent
Sanjurjo

(10) Patent No.: US 7,977,220 B2
(45) Date of Patent: Jul. 12, 2011

(54) SUBSTRATES FOR SILICON SOLAR CELLS AND METHODS OF PRODUCING THE SAME

(75) Inventor: Angel Sanjurjo, San Jose, CA (US)

(73) Assignee: SRI International, Menlo Park, CA (US)

( * ) Notice: Subject to any disclaimer, the term of this patent is extended or adjusted under 35 U.S.C. 154(b) by 116 days.

(21) Appl. No.: 12/397,972

(22) Filed: Mar. 4, 2009

(65) Prior Publication Data
US 2009/0253252 A1    Oct. 8, 2009

Related U.S. Application Data

(60) Provisional application No. 61/034,103, filed on Mar. 5, 2008.

(51) Int. Cl.
*H01L 21/20* (2006.01)
*H01L 21/36* (2006.01)
*H01L 21/4763* (2006.01)
*H01L 21/44* (2006.01)

(52) U.S. Cl. ......... 438/508; 438/627; 438/643; 438/653

(58) Field of Classification Search .................. 438/478, 438/508, 627, 643, 653, 927
See application file for complete search history.

(56) References Cited

U.S. PATENT DOCUMENTS

| 5,855,678 A  * | 1/1999 | Sanjurjo et al. ............... | 118/715 |
| 6,633,069 B2 * | 10/2003 | Nii et al. ........................ | 257/370 |
| 7,510,692 B2 * | 3/2009 | Alvarez et al. ................ | 423/210 |

FOREIGN PATENT DOCUMENTS

DE    20307886 U1    8/2003

OTHER PUBLICATIONS

Invitation to Pay Additional Fees and Annex to Form PCT/ISA/206 Communication Relating to the Results of the Partial International Search, Jun. 24, 2009, consists of 6 unnumbered pages.
PCT Search Report and Written Opinion for PCT/US2009/036050, Aug. 28, 2009, consists of 14 pages.

* cited by examiner

*Primary Examiner* — Chuong A. Luu

(57) ABSTRACT

Aspects of the invention include methods for depositing silicon on a substrate. In certain embodiments, the methods include exposing a substrate containing silicon to a halogenated silane in a manner sufficient to deposit the silicon on the substrate. In certain embodiments, the method includes providing a substrate, one or more sources of gas, and a reaction vessel that is in fluid communication with the substrate and the one or more sources of gas. In certain embodiments, the substrate is a low or metallurgical grade silicon which may be subjected to a purification process. In certain embodiments, the reaction vessel is a particle bed reaction vessel that includes a moving bed, such as a fluidized bed which contains silicon and the gas includes a halide.

50 Claims, 5 Drawing Sheets

SUBSTRATES FOR SILICON SOLAR CELLS AND METHODS OF PRODUCING THE SAME

RELATED APPLICATIONS

This application claims the benefit of U.S. Provisional Application No. 61/034,103 filed on Mar. 5, 2008, which is herein incorporated by reference.

BACKGROUND OF THE DISCLOSURE

There continues to be an increasing demand for the production of high efficiency photovoltaic cells (e.g., solar cells). A solar cell is an electronic device that converts incoming light into electrical energy in the form of a current across a load. Specifically, a solar cell includes two-terminals that are connected to a load in such a manner that a direct current is generated across the terminals when the cell is illuminated by light of an appropriate wavelength.

Solar cells are commonly made of 200-μm-thick wafers of crystalline silicon of high purity. High purity crystalline silicon is a material that involves substantial difficulty and energy to produce and is therefore relatively expensive. Accordingly, there have been a number of efforts to make solar cells out of materials other than thick crystalline silicon wafers. For example, methods of producing solar cells via the deposition of films containing one or more of: CdTe, Cu(In-Ga)Se$_2$, or alloys thereof, onto a variety of surfaces have been explored. However, it has been found that solar cells made out of materials other than high purity crystalline silicon have encountered problems in reaching industrialization because of their lower efficiency, limitations in manufacturing, lifetime, toxic components or limited availability.

The present disclosure provides for a manufacturing process that produces silicon films that may be used directly in the manufacture of efficienct solar cells that are less expensive than the high-grade crystalline silicon wafers that are currently used.

SUMMARY OF THE DISCLOSURE

Aspects of the disclosure include methods for depositing silicon on a substrate. In certain embodiments, the methods include depositing or otherwise contacting a substrate containing silicon with a halogenated silane in a manner sufficient to deposit silicon on the substrate. In certain embodiments, the method includes providing a substrate, one or more sources of gas, and a reaction vessel that is in fluid communication with the substrate and the one or more sources of gas. In certain embodiments, the substrate is a low or metallurgical grade silicon which may be subjected to a purification process prior to deposition of silicon thereon. In certain embodiments, the reaction vessel includes a fluidized bed, and therefore, may be termed a fluidized bed reaction vessel. In certain embodiments, the reaction vessel includes a fluidized bed that contains silicon and the gas includes a halide.

Accordingly, in certain embodiments, the method includes directing a halide gas, e.g., at about 1 atmosphere (atm) of pressure, from a gas source into a silicon containing fluidized bed in such a manner that a halogenated silane is produced and is directed toward a silicon containing substrate for deposition of silicon there on the substrate. In certain embodiments, the method further includes co-depositing one or more dopants on the substrate, for instance, a P or N-type dopant. In other aspects of the disclosure, the substrates thus produced and their use in the fabrication of solar cells are also provided herein.

BRIEF DESCRIPTION OF THE DRAWINGS

According to common practice, the various features of the drawings may not be drawn to scale. Rather, the dimensions of the various features may be arbitrarily expanded or reduced for clarity. Included in the drawings are the following figures.

Figure 1:
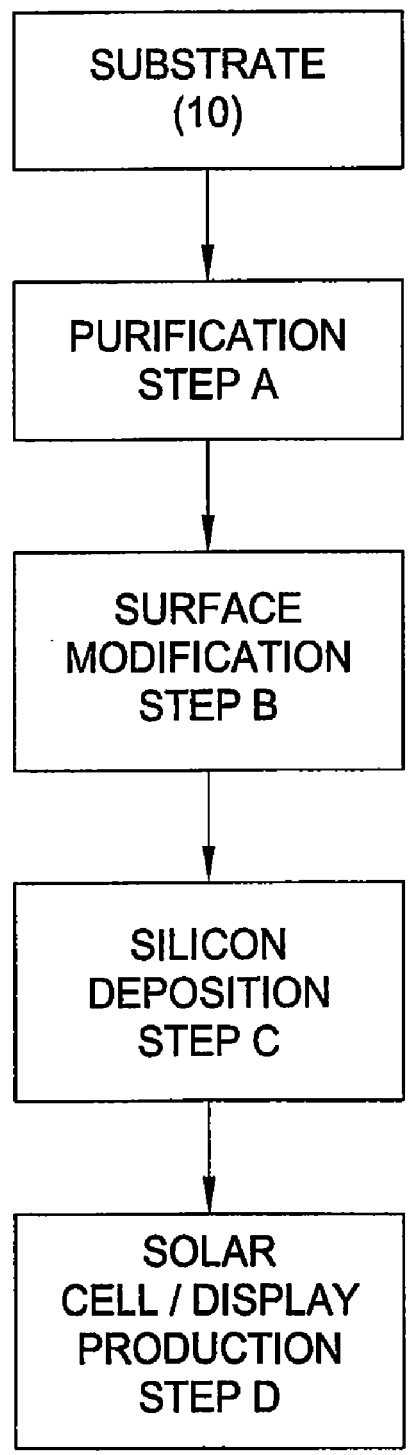
FIG. 1 illustrates an embodiment of a method of the subject disclosure for depositing silicon on a substrate.

Before the present technology is further described, it is to be understood that this disclosure is not limited to particular embodiments described, as such may of course vary. It is also to be understood that the terminology used herein is for the purpose of describing particular embodiments only, and is not intended to be limiting. Unless defined otherwise, all technical and scientific terms used herein have the same meaning as commonly understood by one skilled in the art to which this disclosure belongs.

Where a range of values is provided, it is understood that each intervening value, to the tenth of the unit of the lower limit unless the context clearly dictates otherwise, between the upper and lower limit of that range and any other stated or intervening value in that stated range, is encompassed within the disclosure. The upper and lower limits of these smaller ranges may independently be included in the smaller ranges, and are also encompassed within the disclosure, subject to any specifically excluded limit in the stated range. Where the stated range includes one or both of the limits, ranges excluding either or both of those included limits are also included in the disclosure.

Throughout this application, various publications, patents and published patent applications are cited. The disclosures of these publications, patents and published patent applications referenced in this application are hereby incorporated by reference in their entirety into the present disclosure. Citation herein by the Applicant of a publication, patent, or published patent application is not an admission by the Applicant of said publication, patent, or published patent application as prior art.

It must be noted that as used herein and in the appended claims, the singular forms "a", "and", and "the" include plural referents unless the context clearly dictates otherwise. Thus, for example, reference to a "solar cell or silicon containing substrate" includes a plurality of such materials, and reference to "the halide" includes reference to one or more halides and equivalents thereof known to those skilled in the art, and so forth. It is further noted that the claims may be drafted to exclude any optional element. As such, this statement is intended to serve as antecedent basis for use of such exclusive terminology as "solely", "only" and the like, in connection with the recitation of claim elements, or the use of a "negative" limitation.

As will be apparent to those of skill in the art upon reading this disclosure, each of the individual embodiments described and illustrated herein has discrete components and features which may be readily separated from or combined with the features of any of the other several embodiments without departing from the scope or spirit of the present disclosure. Any recited method can be carried out in the order of events recited or in any other order which is logically possible.

DETAILED DESCRIPTION

Aspects of the disclosure include methods for depositing silicon on a substrate. In certain embodiments, the methods include allowing a halogenated silane to come into contact with a substrate containing silicon in a manner sufficient to deposit the silicon on the substrate. In certain embodiments, the method includes providing a substrate, one or more sources of gas, and a particle bed reaction vessel that is in fluid communication with the substrate and the one or more sources of gas. In certain embodiments, the substrate is a low or metallurgical grade silicon which may be subjected to a purification process prior to deposition thereon. In certain embodiments, the particle bed reaction vessel includes a moving bed, such as a fluidized bed that contains silicon and the gas includes a halide. Accordingly, in certain embodiments, the method includes directing a halide gas from the gas source into the silicon containing particle bed in such a manner that a halogenated silane is produced and is directed toward the silicon containing substrate for deposition thereon. In certain embodiments, the method further includes depositing one or more dopants, for instance, a P or N-type dopant, with a silicon containing substrate. In other aspects of the disclosure, the substrates thus produced and their use in the fabrication of solar cells is also provided herein.

The methods for depositing silicon on to a substrate will be described first, followed by a description of the substrates produced by such methods, as well as their representative use in the production of a solar cell.

Methods for Depositing Silicon on to a Substrate

As summarized above, an aspect of the subject disclosure is directed to a method for depositing silicon on the surface of a substrate (or a layer thereon). Accordingly, in certain embodiments, the methods include the provision of a substrate upon which silicon is to be deposited. Specifically, the term "substrate" refers to any type of base material that has a surface which is considered suitable for receiving the deposition of silicon. For instance, a suitable substrate may include a base material that has a surface which either allows or may be modified to allow for the favorable nucleation and deposition of pure or doped silicon.

Additionally, the term "substrate" may refer not only to the actual substrate but also to the materials deposited on to the substrate during or after any of the various stages of treatment through which the substrate may go during its fabrication, processing, or use, for instance, in the production of solar cells. For example, as will be described in greater detail herein below, in particular embodiments, the term "substrate" refers to any type of material that is suitable for use as a base in the manufacture of a solar cell or a larger system comprising solar cells, wherein the base is configured for receiving a deposited material (e.g., silicon) and being fabricated into one or more solar cells. Accordingly, a substrate, therefore, may be of any suitable size and in any suitable shape, and in certain embodiments, may include a conductive material such that the substrate is conductive.

Further, in describing a substrate, for instance, a substrate containing multiple layers, reference is sometimes made to an "upper" layer, a "top" layer, a "lower" layer and/or a "bottom" layer. In general, an "upper" layer refers to one which is deposited after a preceding layer(s), e.g., a layer described as lower. There is no intention to suggest by this terminology that the deposition must necessarily be done with the "upper" layer lying above the "lower" layer in the ordinary sense of being farther from the center of the earth. Similarly, when reference is made to depositing "atop" or "above" a substrate or a layer of a substrate, what is meant is that the deposited material is added to the side of the substrate to which material has previously been added. There is no implication that the deposition takes place with the material flowing downward in the ordinary sense of flowing towards the center of the earth. There is likewise no implication that no other material exists between layers A and B if layer A is described as being "above" layer B.

In certain embodiments, a substrate for use in accordance with the subject disclosure includes a high temperature material that is inert with respect to silicon, such as the silicon to be deposited thereon. The substrate may include a material that closely matches the thermomechanical properties of silicon, for example, the substrate may have the same or a similar coefficient of thermal expansion as silicon. In certain embodiments, the substrate includes a material that is capable of receiving a silicon film that is to be deposited or otherwise crystallized thereon at high temperature without cracking or introducing stresses. Specifically, in certain embodiments, the substrate is fabricated from a material and in such a manner that it can be heated and cooled from or to room temperature to temperatures close to the melting point of silicon and vice-versa.

In certain embodiments, the substrate may itself be comprised of silicon or silicon dioxide ($SiO_2$), such as a low-cost silicon, for example, a metallurgical grade or an upgraded metallurgical grade silicon. For instance, the silicon substrate may also include silicon containing compounds, such as: $Si_3N_4$, $SiO_yN_x$ (e.g., $SiON_2$), or $MxSiO_3$ (where M denotes a metal such as calcium, magnesium, lanthanides, or mixtures thereof and y and x are integers). The silicon substrate may further include silicon plus one or more fluorides or oxyfluorides, for example, NaF, $CaF_2$, $SrF_2$, or $LaF_3$, LaOF, $SiO_2$, as well as or combinations thereof. In certain embodiments, the substrate (e.g., a low-cost and/or metallurgical grade silicon substrate) may include from about 10% to about 100% silicon and may be fabricated by any known method.

Specifically, the silicon substrate may be fabricated, grown, cast and/or cut from a silicon ingot, wafer, slab, plate, ribbon, or collection of silicon particles. For instance, the silicon substrate may be fabricated from a collection of particles of low or upgraded metallurgical silicon (e.g., of 1 mm or less dimensions) that may be crushed and/or compacted and/or sintered and/or melted, and/or spliced together such that they form a solid substrate surface. The particles may be sintered together by themselves or may be mixed with one or more other compatible materials, for instance, in another phase.

For example, particles of metallurgical grade silicon may be treated or mixed with one or more additional materials to from a substrate containing a surface with an intermedium diffusive barrier. An intermedium diffusive barrier may act as a reflective barrier for charges, photons and the like, and/or may act as a conductive barrier. Accordingly, the intermedium diffusive barrier may serve as a back surface field forming layer (BSF) and may function to protect the silicon to be deposited from outward diffusion of impurities found in the substrate.

A diffusion barrier may be produced by any suitable method, such as via deposition, e.g., by high temperature chemical vapor deposition (CVD) at about 1200 degrees Celsius (° C.) to about 1400° C., or the like. Accordingly, a substrate of the subject disclosure may be reacted with oxygen to form oxides (e.g., oxidation), or with nitrogen or nitrogen-containing compounds to form nitrides and/or silicon nitrides, e.g., SiO, $SiO_2$, $Si_3N_4$, $SiN_4$, SiON, Si AlON, or other transition metal nitrides, or otherwise reacted with other inert, non-contaminating materials that may have a coefficient of thermal expansion that is close to silicon, so as to form a diffusive barrier on the substrate. In this manner a diffusive barrier including silicon may be deposited onto and/or contacted with the substrate, e.g., via oxidation, nitridation, high temperature CVD, or the like.

For instance, in certain embodiments, particles of silicon may be mixed with $SiO_2$ (from sand, a gel, fines, or any silicon or silica precursor), which may then be formed as a plate or tile (including curved shapes), and may then be heated to "harden" and thereby form a composite Si—$SiO_2$ base material that may then provide a good nucleation system upon which a silicon nucleate may be grown. In other embodiments, silicon particles may be coated or mixed with aluminum, for instance, at a low temperature, formed into a wafer-like shape of about 0.1 millimeters (mm) to 10 centimeters (cm) thick, such as 1 mm to 2 cm thick, that may then be heated and/or sintered to form a substrate that includes a silicon-aluminum alloy diffusion barrier which may then be polished and/or used as a base upon which silicon may be deposited. Specifically, a suitable substrate may be heated in a reactive medium to from a substrate that includes silicon and aluminum, such as: AlN or SiAlN or SiAl oxynitrides, which is completely reacted so as to form a glue and/or diffusion barrier. Additionally, a blocking film, such as a silicide, carbide, and/or fluoride may also be produced on the surface of the substrate.

In certain embodiments, the substrate, e.g., a low cost, metallurgical grade silicon substrate or substrate precursor, may be subjected to processing, such as a purification process, polishing process, and/or a process to improve the crystalline domain size of a silicon (e.g., a polycrystalline silicon) that is to be deposited on a surface thereof. The processing may occur before, after or during the deposition of the silicon, or a diffusion barrier containing silicon, on to the surface of the substrate.

For instance, the substrate may be subjected to one or more purification processes, such as a partial melting and evaporation process, a process that involves the oxidization of at least one surface of the substrate, a process that involves exposing the surface to a thermodynamic sink, etching, acid leaching, a selective vaporization process, surface passivation, and/or an Advanced Slagging Process, such as a process described in U.S. Pat. Nos. 4,612,179 and 4,828,814 to Sanjurjo et al., which references are incorporated herein in their entirety by reference. For example, in certain embodiments, the processing may, for example, be thermal processing in which heat is used to improve the quality of the silicon containing substrate, such as to improve its crystallinity and/or decrease its impurity concentration, in a zone close to the silicon surface onto which deposition will take place. In certain embodiments, this processing occurs before the production of a diffusion barrier upon the surface of the substrate.

The processing may take place in one or more steps. For example, the processing may include a first substrate treatment step that involves the outward diffusion of impurities, for instance, at high temperatures, such as from about 1100° C. to about 1410° C. (e.g., below the melting point of Si), and may include one or more subsequent processing steps, which may include the removing of an impurity sink from the surface of the substrate (e.g., leach removal of the thermochemical sink) and/or the production of a diffusion barrier and/or the opening of vias in a diffusion barrier.

Specifically, in certain embodiments, the substrate is heated to just below the melting point of silicon and then exposed to a purifying agent that acts as an impurity sink extracting the impurities out of the substrate, e.g., a silicon substrate, without reacting with the underlying material, e.g., the silicon of the substrate. A suitable purifying agent may include silicon oxide, a silicate, or a halide of: lithium, sodium, potassium, magnesium, strontium, calcium, or barium, such as $SiO_2$, NaF, $Na_2SiO_3$, or a suitable slag thereof.

In certain embodiments, the processing includes a step that takes place at a high temperature, for instance, a temperature ranging from over 1000° C. to about 1420° C., such as from about 1300° C. to about 1410° C., including about 1350° C. to about 1400° C. Once processed, the substrate may be cooled and separated from the impurity sink by any suitable method. In certain embodiments, the processing, such as purification processing, results in a reduction in the concentration of impurities, such as iron, aluminum, calcium, chromium, nickel, and the like, from about 90% to about 99.99%, including about 98% to about 99.999%.

As described above, in certain embodiments, the substrate is subjected to surface modification, wherein a diffusion barrier is produced on the surface of the substrate, for instance, after the substrate has been subjected to an advanced slagging purification process. The modification layer may be produced in any suitable manner, as described above, and may result in the production of an oxide layer, nitride layer, silicon nitride layer, oxide nitride layer or similar diffusion barrier on the surface of the substrate that may also function to reduce surface recombination. Accordingly, in certain embodiments, once a diffusion barrier is produced small openings may be made in the diffusion barrier on the surface of the substrate so as to expose the surface of the substrate underneath.

Specifically, where the substrate includes silicon, openings or vias may be made in the diffusion barrier so as to expose areas (e.g., areas of bare silicon) of the substrate beneath the diffusion barrier to enhance the deposition of the silicon onto the surface of the substrate and tailor the shape and/or grain size of the deposit. For example, the vias produced may be used as a nucleation center for guiding the growth of silicon crystals to be deposited on the surface.

The openings may have any suitable shape and may be of any suitable size. For example, the openings may have a regular or irregular square, rectangular, triangular, circular, elliptical, polygonal, or other suitable shape. In certain embodiments, the openings may be from about 1 nanometer (nm) to about 100 micormeter ($\mu$m) in diameter, for instance, about 10 nm to about 10 $\mu$m, such as about 100 nm to about 500 nm in diameter, and may be spaced apart at distances ranging from about 10 nm to about 100 $\mu$m, including 100 nm to about 10 $\mu$m, such as about 500 nm to about 1 $\mu$m.

The openings may be produced by any suitable method, such as mechanical means, chemical means, chemomechanical means, and/or the like, such as: scratching, sand blasting, drop etching, laser ablation, laser etching, surface ruffling, etc. For instance, a fine-abrasive-tipped instrument or other silicon carbide abrasive may be used to press and scratch the substrate in such a manner that a suitable opening is produced. In this manner, the openings may determine the size and/or shape of the silicon crystal to be grown thereon, thus, the subject disclosure allows for the texturing of the grain itself. Accordingly, the openings may be of regular or irregular size, orientation and placement. Once produced, the openings may serve as nucleation centers, for instance, silicon nucleation centers that are spaced from about 1 micron to about 100 μm, such as about 1 μm to about 10 μm, including about 1 μm to about 5 μm apart from one another.

The openings may be treated or otherwise brought into contact with a growth modifier that may function to assist the movement of deposited silicon atoms atop them, thereby accelerating diffusion, which accelerated diffusion of the deposited silicon may, in turn, facilitate and improve crystal growth. The openings may be filled or surface treated, for instance, with a growth modifier, such as a metal that includes but is not limited hereto: aluminum (Al), lead (Pb), silver (Ag), copper (Cu), tin (Sn), or their respective halides or alloys so as to produce a metal film layer. For instance, a growth modifier may be deposited on the surface of the substrate by any known method, including physical vapor deposition (PVD), chemical vapor deposition (CVD) or the like. Additionally, the substrate, e.g., a processed substrate, may be treated or etched to produce a non-reflective or corrugated surface. The etching may be for any suitable length of time so as to produce a surface that is corrugated. Elements such as Al may be allowed to diffuse into the silicon body to form highly doped areas of P++.

The methods of the subject disclosure may include the provision of at least one gas. The gas may be at a pressure of 1 atm or more. For instance, in certain embodiments, one or more sources of a pressurized gas are provided. Accordingly, in certain embodiments, the methods of the subject disclosure include the provision of at least one pressurized gas, which gas is contained within a pressurized gas source and is directed into a suitable reaction vessel wherein the gas is exposed to the surface of a substrate contained therein. In certain embodiments, the gas is not under pressure. In certain embodiments, the gas is delivered under atmospheric pressure.

In certain embodiments, the gas is directed directly into a reaction vessel wherein the reaction vessel includes a substrate upon which silicon is to be deposited. For instance, the reaction vessel may be constructed such that the gas is directed so as to come directly or indirectly into contact with a substrate therein, that is without first contacting another medium, such as a reaction bed. In certain embodiments, the gas is directed in such a manner that it comes into contact with the substrate substantially normal to the surface of the substrate. In certain embodiments, the gas is directed in such that it comes into contact with the surface of the substrate in a manner that is non-normal to the surface, for instance, substantially parallel to the surface. In certain embodiments, as is described in greater detail herein below, the reaction vessel includes a reaction bed, for instance, a bed that includes a silicon, and the gas is directed into the reaction bed prior to contacting the surface of the substrate. For instance, in certain embodiments, a gas is directed into the silicon-containing reaction bed in such a manner and at such a temperature so as to release silicon in the form of a halogenated silane from the reaction bed toward the substrate for deposition thereon.

Any suitable gas may be used. For instance, in certain embodiments the gas may include a suitable silane for deposition onto the silicon containing substrate. In certain embodiments, the gas is a gas that is capable of interacting with one or more reactants to produce a silicon species that is to be deposited on the surface of the substrate and/or on a surface layer thereof. For example, a suitable gas may include a halide, such as one or more of chlorine, bromine, fluorine, iodine, and the like. Further, in certain embodiments, a suitable gas may include a silane. Accordingly, in certain embodiments, a suitable gas may include both a halide and a silane, for example, a suitable gas may be a halosilane, such as chlorosilane, bromosilane, fluorosilane, or iodosilane. For instance, a suitable halide-containing gas may be $SiF_4$, $SiCl_4$, $HSiCl_3$, $H_2SiCl_2$, $SiHBr_3$, $SiBr_4$, $SiI_4$, $SiI_2$, and mixtures thereof. In certain embodiments, the gas is a chlorosilane. In certain embodiments, the gas is a mixture of a halide and hydrogen, for instance, HCl, HBr. In certain embodiments, the gas is a halide.

In certain embodiments, one or more additional gasses may also be provided, for instance, a carrier gas and/or gas source, may be provided. For instance, hydrogen or helium gas and/or an inert carrier gas, such as argon, may be provided. In certain embodiments, the one or more additional gasses include a dopant.

In certain embodiments, the methods of the subject disclosure include the deposition of silicon onto a surface of a substrate, e.g., a processed and/or substantially purified surface of a substrate. By "substantially purified" is meant a surface of a substrate that has been processed in such a manner that the amount of impurities therein has been reduced as compared to the amount of impurities in the surface of the substrate prior to the processing. For instance, in certain embodiments, a silicon containing substrate before the processing step may be about 90% or about 95% or about 98.5% pure silicon and after the purification step the substrate is substantially purified such that the substrate and/or a surface thereof is greater than 90%, greater than 95%, greater than 98.5% pure, for instance, about 99%, about 99.9%, about 99.99%, or even greater than 99.999% pure.

The process of deposition of the silicon on the substrate may be carried out by a variety of techniques. For instance, in certain embodiments, a method of the subject disclosure may include diffusion, chemical vapor deposition, chemical vapor transport, sublimation of silicon, and/or the like. In certain embodiments, the deposition involves the use of a particle bed reactor and more preferably a moving bed reactor, and more preferably a fluidized-bed reactor process.

In certain embodiments, the reaction vessel includes a fluidized bed. For example, a suitable fluid bed reactor vessel and processes for its use in accordance with the subject disclosure includes those described in U.S. Pat. No. 5,855,678 to Sanjurjo et al, which patent is incorporated herein by reference. The bed reactor may be any suitable reactor and may include a fixed bed, a moving bed, a fluid bed, a vibrating bed, a cascading bed, a rotating bed, and the like.

Hence, in accordance with certain methods of the subject disclosure, a fluidized bed reaction vessel may be provided, wherein the fluidized bed reaction vessel includes a fluidized bed. The fluidized bed may include one or more sources of sacrificial materials. A feed stock material for use in conjunction with in a fluid bed of the disclosure may be any suitable material, obtained by any suitable source, and be of any suitable size or shape. For instance, in certain embodiments, the feed stock includes silicon, a boron doped silicon, or a phosphorus doped silicon, as described below.

For instance, in certain embodiments, the sacrificial material may be in the form of a single solid piece, such as a slab, an ingot, a wafer, a ribbon, a porous body, a briquet, or the like. In certain embodiments, the material may be a powder including a plurality of particles. In certain embodiments, the fluidized bed may include a sacrificial silicon material, which may be in the form of a slab, an ingot, a wafer, a porous body, a briquet, and/or may be in the form of silicon particulate matter (e.g., powder). In certain embodiments, the sacrificial material is particulate silicon matter, for instance, ultrahigh purity silicon powder. In certain embodiments, the particulate silicon includes silicon that is doped.

Accordingly, in certain embodiments, a method of the disclosure further includes exposing the substrate to at least one suitable dopant molecule. Any suitable dopant may be used to dope the substrate. For example, a suitable dopant may be a P-type and/or an N-type dopant. For instance, in certain embodiments, the dopant is a P-type dopant that includes Boron or Aluminum. In certain embodiments, the P-type dopant is one or more of a Boron halide, borane, diborane, a B—H species, $B_2H_6$, $BCl_3$, a decaborane, and mixtures thereof. In certain embodiments, the dopant is an N-type dopant that includes a Group V element or a volatile precursor thereof. For instance, in certain embodiments, the N-type dopant includes phosphorus (P) or antimony (Sb), such as $PCl_3$, $PCl_5$, $SbCl_5$, or mixtures thereof.

In certain embodiments, the exposure of the surface of the substrate with a suitable dopant(s) results in the production of a P layer, P+ layer, P++layer, N layer, N+ layer, N++layer and/or the like. For instance, in certain embodiments, exposing the surface of the substrate to a suitable dopant results in the production of both a P and an N layer, for instance, exposing the substrate sequentially to dopants may result in the formation of a PN junction. For example, in certain embodiments the substrate may be exposed to both silicon and a P-type and/or N-type dopant one or more times (e.g., in a sequential manner).

The one or more dopants may be exposed, or otherwise, brought into contact with the substrate in any suitable manner and in any suitable order. For instance, the dopant may be exposed to the substrate using any growth and/or diffusion technique, such as chemical vapor deposition, chemical vapor transport, or the like. For example, in certain embodiments, the dopant may be a component within the fluid bed. For instance, the sacrificial material in the fluidized bed may previously have been doped, such that the fluid bed includes a dopant molecule, for instance, silicon that has previously been doped, e.g., with a P or N-type dopant. In certain embodiments, the dopant may be added to the fluid bed reaction vessel as a suitable gas, e.g., from a gas from a suitable gas source.

Accordingly, in certain embodiments, the contacting of the substrate with silicon also results in the contacting of the substrate with the dopant, for instance, where the sacrificial source in the fluid bed includes a doped silicon. Thus, in certain embodiments, the process of depositing or growing silicon on the surface of the substrate also results in the process of depositing a dopant layer on the surface of the substrate, for instance, where the fluid bed includes a dopant constituent or where the dopant is delivered, e.g., as a gas, substantially at the same time as the etching gas is delivered to the fluidized bed. In certain embodiments, the substrate is first contacted with silicon, e.g., as a halogenated silane, and then exposed to a dopant molecule from a suitable dopant source.

Hence, the substrate may be exposed and/or coated in such a manner so as to first produce a silicon layer that contains a P or N-type dopant. In certain embodiments, the substrate may be exposed to a silicon/dopant combination in such a manner that a P or N-type doped silicon layer is produced. Further, the substrate may be exposed to a P-type dopant before or after being exposed to an N-type dopant. For instance, in certain embodiments, the resultant substrate includes a P layer upon which an N layer is deposited, and in certain embodiments, the substrate includes an N layer upon which a P layer is deposited. Accordingly, the order in which the substrate is exposed to or otherwise contacted with a suitable P or N-type dopant may vary dependant on the type of P and N junction that is sought to be produced.

Specifically, in certain embodiments, a suitably processed substrate is exposed to and/or coated with a light-absorbing P doped silicon so as to form a light-absorbing P layer that includes a P-type dopant (e.g., B or Ga). The substrate may then be exposed to and/or coated with a N-type dopant, (e.g., from a suitable N-type doped sacrificial silicon source) which comes into contact with the substrate on top of the P layer in such a manner so as to give the substrate a PN functionality. As set forth above, this order may be reversed and or repeated (e.g., sequentially).

Accordingly, the substrate may be grown and/or coated with silicon and/or one or more dopants in such a manner as to form one or more layers. The layers, including dopant layers, may be deposited, grown on and/or contacted with the substrate in one or more layering processes. For instance, in certain embodiments, the contacting of a sacrificial silicon source, within a fluidized bed of a fluid bed reaction vessel, with a suitable gas, e.g., a halide containing gas, from a suitable gas source, results in the etching of the silicon in the fluid bed and an increase in partial pressure of silanes, e.g., chlorosilanes, in the gas phase inside of the reaction vessel, which silanes then contact the surface of the substrate and form a thin-film layer thereon. Specifically, in certain embodiments, the fluidized bed may be positioned within the reaction vessel in such a manner that the fluid bed is between the substrate and the source of gas such that when the gas is introduced into the fluidized bed it contacts silicon in the fluidized bed, which silicon is etched upon contact with the gas, and upon contact with the substrate, coats the surface of the substrate with a silicon layer.

The silicon layer, which may include a dopant, may be of any suitable thickness. For example, the layer may be a thin-film of one or more layers of silicon that ranges from about 1 micron to about 100 microns thick, for instance, from about 10 microns to about 50 microns thick, including about 7 microns to about 35 microns thick. The silicon thin-film layer produced on the surface of the substrate may be the result of exposing the substrate to silicon in one or more processes so as to form one or more layers, including multiple stacked P and N layer pairs.

For instance, in certain embodiments, the silicon thin-film is the result of exposing the substrate to silicon in such a manner so as to produce a plurality of thin-film layers. The silicon thin-film produced on the surface of the substrate may include 2, 3, 4, 5, 6, 7, 8 or more thin-film layers of silicon that are each between 1 micron to about 50 microns thick, such as 5 microns to about 35 microns thick, including 7 microns thick. In certain instances, the total thickness of the silicon layer produced on the surface of the substrate may be from about 10 microns to about 50 microns or more. In certain embodiments, the total thickness of the silicon layer is about 35 microns thick and may include 5 layers of a silicon thin-film, wherein each layer is 7 microns thick, or may include 7 layers of a silicon thin-film, wherein each layer is 5 microns thick. The deposition, or otherwise, contacting of silicon on the surface of the substrate so as to form a thin-film layer may occur at any suitable rate, for instance, at a rate of from about 1 micron per minute to about 30 microns per minute, such as about 2 microns per minute to 10 microns per minute.

In certain embodiments, a thin-layer may be characterized as including a thicker thin-layer and/or a thinner thin-layer. For instance, in certain embodiments, a thicker thin-layer is produced upon which a thinner thin-layer is then produced. For instance, in certain embodiments, a thick P or N layer is produced, upon which a second, thinner N or P layer (respectively) is produced. Specifically, a thicker layer, for instance, of about 10 microns to about 100 microns, including about 25 microns to 70 microns, may be produced on a substrate. This layer may be a P or N-type dopant layer containing silicon.

The thicker layer may then be contacted with a thinner layer, for instance, of about 0.1 micron to about 3 microns. This layer may be an N or P-type dopant layer containing silicon. In certain embodiments, a back surface layer (BSF) may be deposited on the substrate, which layer may comprise a P+ layer.

In certain embodiments, the temperature within the reaction vessel is such that it forms one or more reaction zones. For instance, in certain embodiments, where the reactor includes a fluidized bed, the reaction vessel may include a bed zone and a substrate zone. In certain embodiments, the temperature of the bed zone is different from the temperature of the substrate zone. Accordingly, in certain embodiments, the temperature of the bed zone may be at a higher or lower temperature than the substrate zone.

Specifically, in certain embodiments, the temperature of the bed zone, and consequently, the temperature of the sacrificial material within the fluidized bed (e.g., silicon) may be at temperature that is lower than the temperature of the substrate zone. In such an embodiment, the temperature of the substrate zone, and thus the substrate, may be at a temperature that is higher than the bed zone. For instance, in certain embodiments, during the process of deposition, the substrate may be at a higher temperature than the bed zone and/or silicon therein. For example, the temperature of the substrate zone and/or substrate may be more than about 900° C., more than about 1200° C., or more than about 1250° C., so as to enhance the size of silicon crystal to be deposited thereon. Of course, in certain embodiments, the temperature of the fluidized bed within the bed zone may be higher than the temperature of the substrate within the substrate zone or vice versa.

The temperature of either zone may be from 0° C. to about 1420° C., for instance, about 100° C. to about 1410° C., such as about 200° C. to about 1400° C., including about 1300° C. to about 1350° C. Thermal energy may be applied to the reaction vessel and/or different reaction zones and maintained therein by any suitable heating means including: conduction heating, convention heating, resistance heating, induction heating, the application of light, radio-frequency heating, microwave heating, radiation heating, laser heating, arc heating, gas heating and/or the like. For instance, the bed temperature may be kept below about 600° C., for instance, below about 400° C., such as below about 300° C. However, bed temperature may be higher, for example above about 1200° C., above about 1300° C., or above about 1350° C.

The thermal energy or heat may be applied in accordance with any suitable protocol for a sufficient time period so as to cause the particulate matter within the fluidized bed to become fluid. In certain embodiments, the reaction zones within the reaction vessel may be heated for a total time period that ranges from several minutes to several hours, which time period may include several different ramping and/or dwelling periods.

Accordingly, a representative embodiment of the methods of the disclosure can be seen with reference to FIG. 1. In a first step, a suitable silicon containing substrate (10) (e.g., of low cost, metallurgical grade silicon) is either provided or is fabricated, for instance, from a source of silicon powder that is consolidated under suitable reaction conditions to form a substrate (10). The substrate (10) may then subjected to a suitable purification step, for instance, an advanced slagging process, wherein any impurities within the substrate (10) may diffuse into a purification sink, which sink may then be removed from the surface of the substrate (10).

Once the sink has been removed, e.g., mechanically or chemically, and the surface of the substrate (10) suitably purified, the surface of the substrate (10) may be further processed, for example, in a surface modification step B. For instance, the surface may be treated in such a manner so as to produce a diffusion barrier on the surface of the substrate (10). The diffusion barrier may act as a barrier to any impurities that may remain in the silicon containing substrate (10).

Once produced, the diffusion barrier may be manipulated in such a manner so as to create holes or vias in the diffusion barrier, where in the holes the surface of the underlying substrate (10) is exposed. It is to be noted that although this process has been described with reference to the production of a diffusion barrier on the surface of the substrate, in certain embodiments, this or any other step may be omitted or performed in a different sequence.

The substrate (10) may then be contacted with a suitable gas, such as a silane containing gas in a silicon deposition step C. In certain embodiments, the gas comes into contact, e.g., indirect contact, with the surface of the substrate (10) (e.g., a diffusion barrier and/or via thereon) after passing through a reaction bed. In certain embodiments, the gas comes into contact, such as direct contact, with the substrate (10) without prior passing through a reaction bed. The gas comes into contact, e.g., direct or indirect contact, with the surface of the substrate (10) in such a manner that silicon within the gas is deposited or otherwise grown on the surface of the substrate (10) (e.g., at nucleation centers created by vias scratched in the surface of the diffusion barrier on the surface of the substrate).

As set forth above, the fluid bed may contain a doped silicon feed material, or the gas may contain a doped silicon, for instance, a doped halosilane. Thus, in this manner, a suitable silicon containing substrate (10) may be processed in such a manner so as to produce a P, N, or P and N doped substrate, which substrate (10) may then be used in the fabrication of a solar cell or display screen, such as a flat panel display screen.

Figure 2:
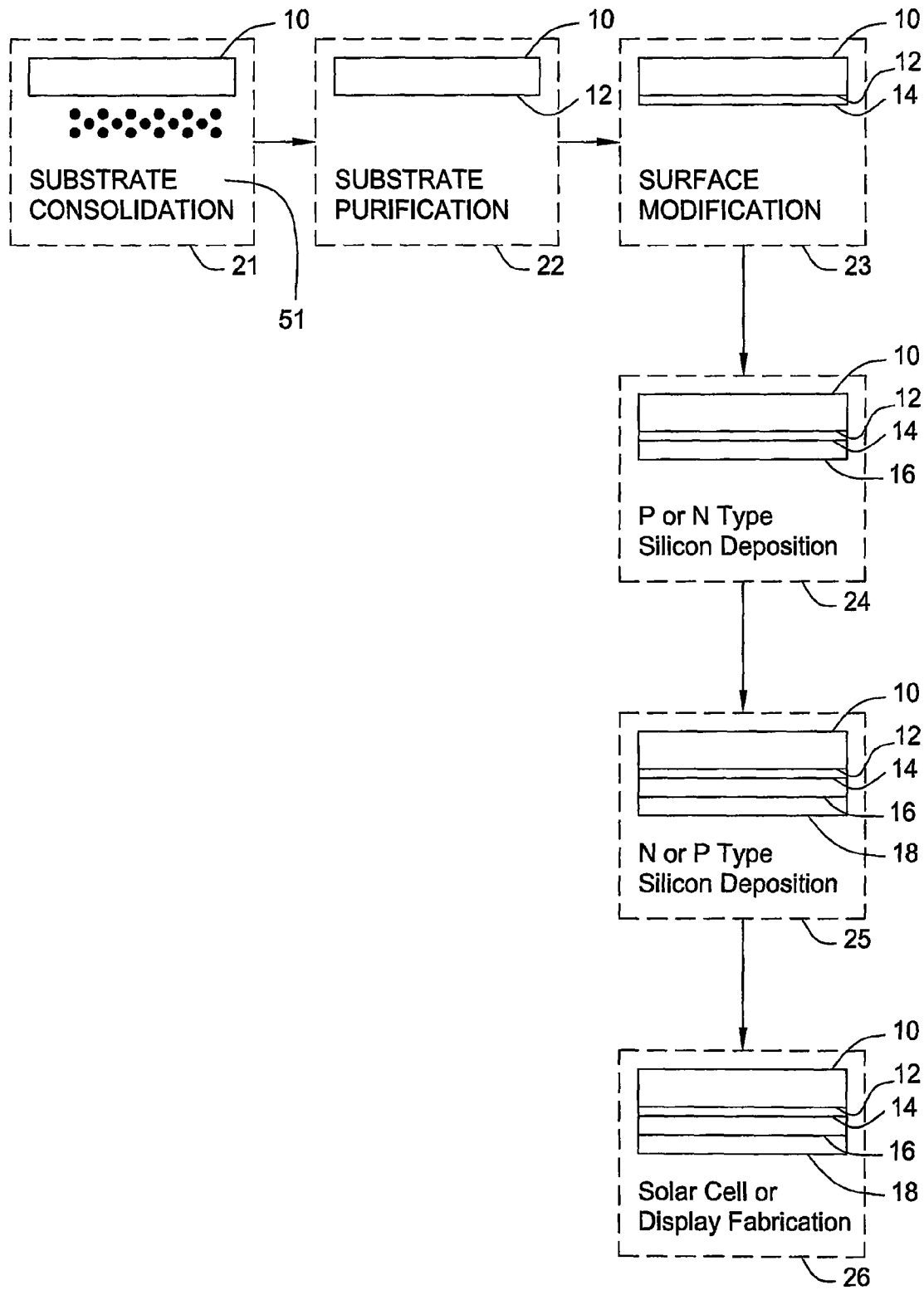
FIG. 2 illustrates an embodiment of a system of six reaction vessels for the production of a substrate including silicon deposited thereon.

Hence, in accordance with the above methods, an aspect of the subject disclosure provides for a suitable reaction vessel (s) within which a suitable substrate may be produced and or processed. For instance, as set forth in FIG. 2, in certain embodiments, a system of one or more reaction vessels may be provided in which the substrate (10) may be processed. As can be seen with reference to FIG. 2, one, two, three, four, five, six, or more different reaction vessels may be provided. Specifically, FIG. 2 provides a system that includes six different reaction vessels.

A first reaction vessel (21) may be provided so as to fabricate a suitable substrate (10), for instance, via the consolidation of silicon powder or fines (51). A second reaction vessel (22) may be provided so as to purify the substrate fabricated in the first reaction vessel (21). For instance, the second reaction vessel (22) may be a vessel in which the substrate (10) is subjected to an advanced slagging process. A third reaction vessel (23) may be provided in which a modification process takes place. For instance, in a third reaction vessel (23) the substrate (10) may be subjected to a process that coats the surface of the substrate (12) with a diffusion barrier (14). A fourth and/or fifth reaction vessel (24 and 25) may be provided in which the substrate (10) is exposed to a suitably N and/or P doped silicon thus producing an N and/or P-type doped silicon layer (16) and/or (18) on the modified surface layer (14) of the substrate (10). Such a reaction vessel(s) may include a reaction bed, such as a fluidized reaction bed (not shown). A sixth reaction vessel (26) may also be provided, in which the substrate (10) is converted into a suitable solar cell or fabricated into a suitable display, such as a flat panel display.

It is to be noted that although the system has been set forth with reference to six reaction vessels, more or less than six reaction vessels may be included. For instance, in certain embodiments, additional reaction vessels are included, for example, in which vias are created in the substrate prior to subjecting the substrate to silicon deposition. Of course, such vias may be produced without being introduced into a reaction vessel, e.g., manually. In certain embodiments, fewer reaction vessels are included, such as three or even one reaction vessel.

Figure 3:
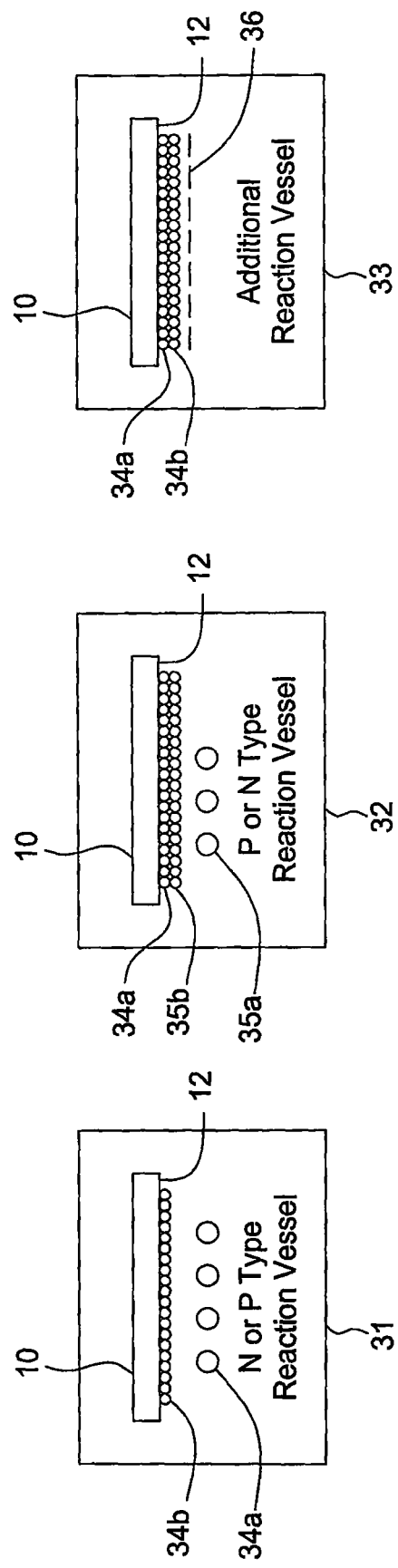
FIG. 3 illustrates another embodiment of a system of three reaction vessels for the production of a substrate including silicon deposited thereon.

For instance, as can be seen with reference to FIG. 3, in certain embodiments, only three reaction vessels may be included 31, 32, and 33. These reaction vessels may include two silicon deposition vessels (31 and 32) and an additional reaction vessel (33). For example, the first reaction vessel (31) may be a reaction vessel in which a doped silicon (34a) is deposited on the surface (12) of a substrate (10), e.g., a N or P doped silicon (34a), which then forms an N or P doped surface (34b) on substrate (10). The second reaction vessel may be a reaction vessel wherein a P or N doped silicon (35a) is deposited on the surface (12) of the substrate (10), which then forms a P or N doped surface (35b) on surface (34a), which is on substrate (10). Of course, this order may be reversed.

For instance, where the first reaction vessel (31) allows the deposition of an N type silicon (34a) on to the surface (12) of the substrate (10) to produce a substrate (10) including N-type doped silicon surface (34b), the second reaction vessel (32) may be such that it allows the deposition of a P-type silicon (35a) on to the N-type doped silicon surface (34b) of surface (12) of the substrate (10) to produce a substrate with a N-P junction, or vice-versa. An additional reaction vessel (33) may also be included in which the substrate surface (12) may be treated so as to oxidize the surface or otherwise provide an anti-reflection layer thereon (36). It is to be noted that although the system has been set forth with reference to three reaction vessels, more or less than three reaction vessels may be included. For instance, in certain embodiments, fewer reaction vessels are included, such as one reaction vessel.

Figure 4:
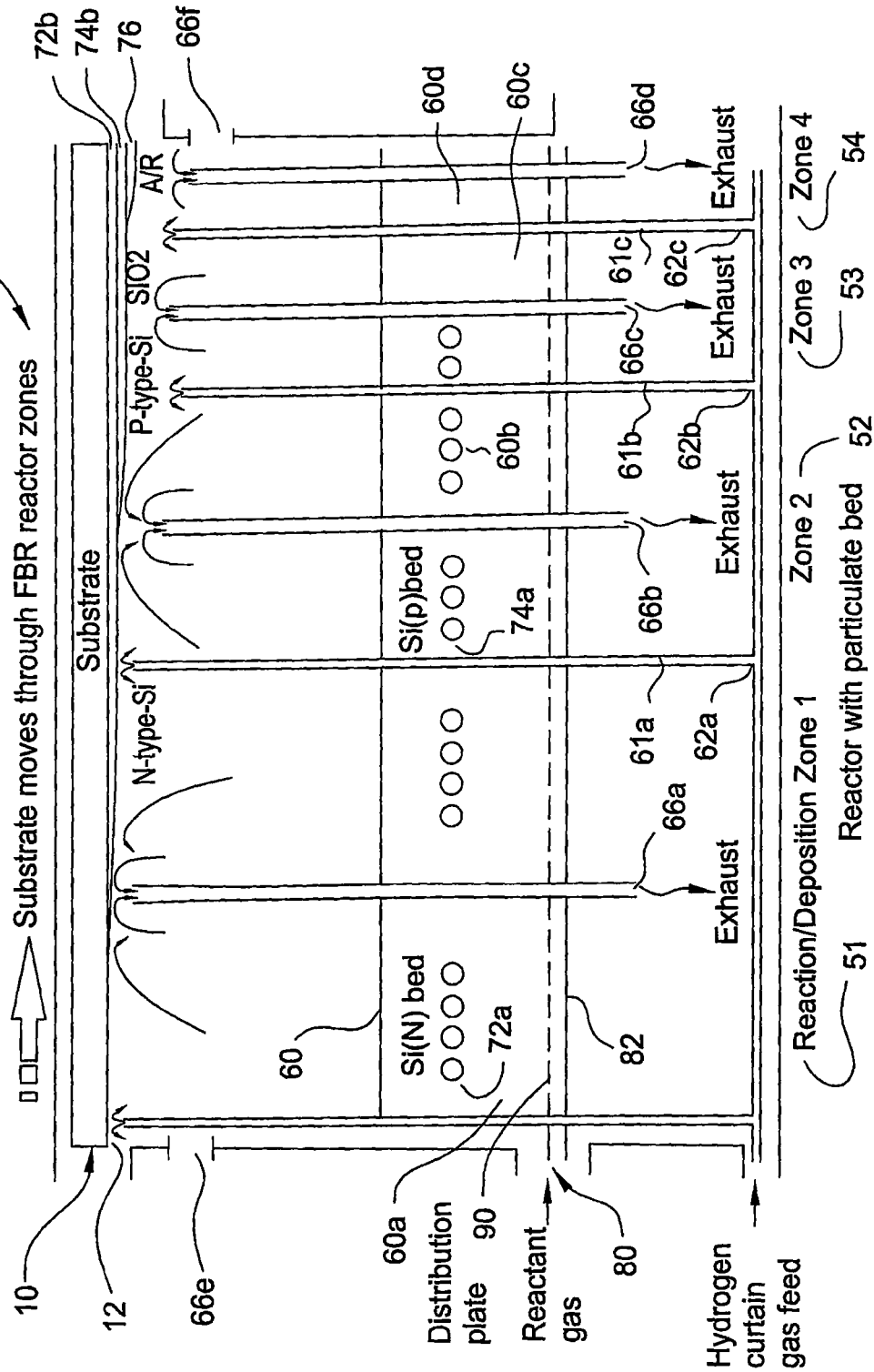
FIG. 4 illustrates an embodiment of a continuous feed reaction vessel containing a reaction bed.

For example, with reference to FIG. 4, a single reaction vessel may be provided. The single reaction vessel (4) may include several different zones (51, 52, 53 and 54). For instance, as can be seen with reference to FIG. 4, a suitable reaction vessel may include a reaction bed (60). The reaction bed (60) may include one, two, three or more zones (e.g., 51, 52, 53, and 54). In certain embodiments, the reaction bed includes an N-type dopant zone (51), a P-type dopant zone (52), and additional reaction zones (53 and 54), such as a zone that may allow the surface of the substrate to be oxidized and/or treated so as to produce an anti-reflection layer. Of course, this order may be changed.

In certain embodiments, the reaction bed (60) may be separated into beds (60a, 60b, 60c, and 60d) by one or more in-lets or out-lets. For instance, in certain embodiments, the beds (60a, 60b, 60c, and 60d) are separated by inlets (61a, 61b, 61c), such as gas inlets that form a gas wall or knife (62a, 62b, 62c) so that the beds and/or the area above the beds is separated one form the other. In certain embodiments, the inlets are channels or tubes, which function to separate the beds and or the areas above the beds from one another, such that the constituents therein (e.g., doped silicon feed material or halogenated silane gasses) are separated one from another. The walls may completely or partially separate the beds and/or the areas above the beds from one another.

In certain embodiments, the reaction vessel and/or beds within the vessel also include one or more out-lets (66a, 66b, 66c, 66d, 66e, 66f). For instance, in certain embodiments, the reaction vessel (4) includes a plurality of out-lets, at least one or two or more of which allow a gas constituent within the vessel to exit from the reaction vessel and/or to be recycled. As shown in FIG. 4, the outlets (66a, 66b, 66c and 66d) may be tubes that are included within the bed(s) and/or may be located at other places within the reaction vessel (66e, 66f).

In certain embodiments, the reaction vessel (4) is adapted to allow the deposition of silicon onto the surface (12) of a suitable substrate (10), while the substrate is fed into the reaction vessel (4), for instance, from another vessel, such as a fabrication vessel (not shown). For instance, in certain embodiments, the reaction vessel is a continuous feed reaction vessel, wherein the substrate (10) and/or one or more gas constituents (demarcated by arrows) or feed material (72a, 74a) are continuously fed into the reaction vessel (4) for a short or prolonged period of time.

For instance, as set forth in FIG. 4, a continuous feed reaction vessel (4) is provided, wherein an elongated substrate (10) is continuously fed into the reaction vessel (4), where in the reaction vessel (4), the surface (12) of the substrate (10) is coated with a doped silicon layer, such as a N doped and/or a P doped silicon layer (72b and 74b). As can be seen with reference to FIG. 4, the substrate (10) is fed into the reaction vessel (4) from the left and travels to the right. Additionally, a reactant gas (e.g. a halide gas), which may include a carrier gas (e.g., Ar), may be fed into the reaction vessel (4) via a gas carrier assembly (80), which gas enters the various reaction beds (60a, 60b, 60c, and/or 60d) via openings in a distribution plate (90).

As the substrate (10) travels into and through the reaction vessel (4) the substrate (10) is first exposed to a reaction zone (51) that includes a reaction bed (60a) that contains an N-type doped silicon feed material (72a). In this manner, a gas (demarcated by arrows), such as a halide gas, enters the reaction bed (60a), via the gas carrier assembly (80) and the distribution plate (90), which gas etches the N doped silicon particles (72a) therein, thereby producing a silicon containing gas (e.g., a halosilane) that upon contact with the surface (12) of the substrate (10), coats the surface with an N doped silicon layer (72b).

As the substrate (10) continues to travel through the reaction vessel (4), the substrate is then exposed to a second reaction zone (52) containing a reaction bed (60b) that includes a P-type doped silicon feed material (74a). In this manner, a gas (demarcated by arrows), such as a halide gas, enters the reaction bed (60b) and etches the P doped silicon particles (74a) therein, which thereby produces a silicon containing gas (e.g., a halogenated silane) that upon contact with the surface (12) containing N-type doped silicon layer (72b), coats the substrate (10) with a P doped silicon layer (74b), thereby forming an N-P junction on the substrate (10).

As seen in FIG. 4, a third and fourth portion of the reaction vessel (4) includes an oxidation and anti-reflection zones (52 and 54, respectively) wherein the surface (12) of the substrate (10) may then be oxidized and/or coated with an anti-reflection layer (76). The reaction vessel may also include a gas carrier assembly (80) and distribution plate (90) with gas inlets (82) that allow a suitable gas, e.g., a halide and/or Ar carrier gas, to enter the various reaction beds (60a, 60b, 60c, and 60d) of the reaction chambers or zones of the reaction vessel (4), so as to contact the silicone feed material (e.g., doped silicon feed material) so as to produce a silane containing gas that may be used to coat the surface of a substrate (e.g., a silicon containing substrate) with silicon.

Figure 5:
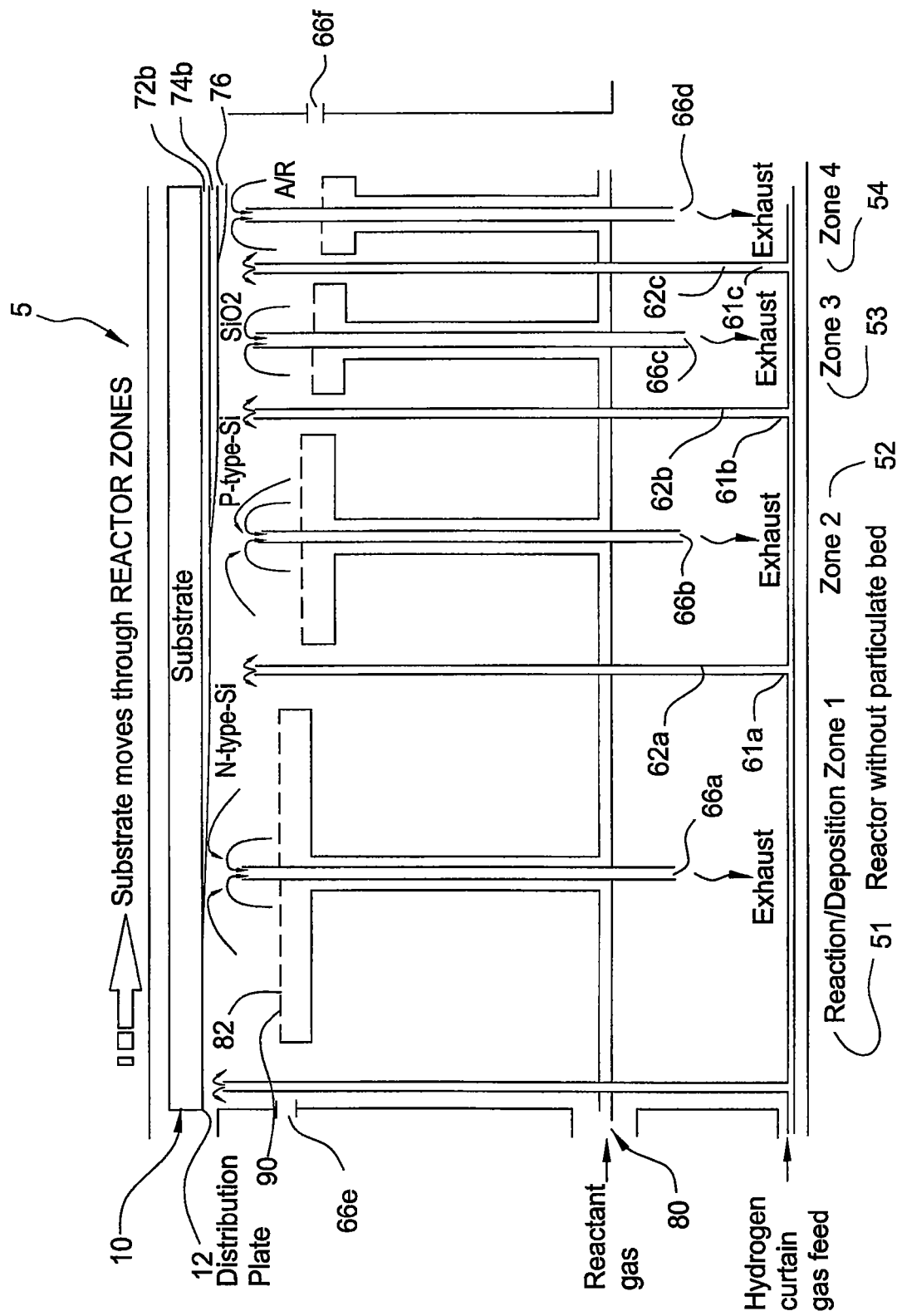
FIG. 5 illustrates an embodiment of a continuous feed reaction vessel, wherein the reaction vessel does not contain a reaction bed.

In an alternative embodiment, as can be seen with reference to FIG. 5 a different configuration of single reaction vessel may be provided. In this embodiment, the reaction vessel (5)

does not include a reaction bed. Rather, the reaction vessel (5) is configured for directing a silicon containing gas, such as a halosilane, toward the surface (12) of a substrate (10). The reaction vessel (5) includes different zones (51, 52, 53 and 54). In certain embodiments, the different reaction zones allow for the surface of the substrate to be contacted with a suitably doped silicon gas, for instance, an N-type dopant gas (zone 51) and a P-type dopant gas (zone 52). In certain embodiments, the reaction vessel includes additional reaction zones (53 and 54), such as a zone that may allow the surface of the substrate to be contacted with an additional gas so as to cause the surface (12) of the substrate (10) to be oxidized and/or treated so as to produce an antireflection layer. Of course, this order may be changed.

In certain embodiments, the reaction zones (51, 52, 53, and 54) of the reaction vessel (5) may be separated by one or more inlets or outlets. For instance, in certain embodiments, the zones (51, 52, 53, and 54) are separated by inlets (61a, 61b, 61c), such as gas inlets that form a gas wall or knife (62a, 62b, 62c) whereby the reaction zones are separated one form the other. In certain embodiments, the inlets may but need not include channels or tubes, which function to separate the beds and or the areas above the beds from one another, such that the constituents therein (e.g., doped silicon feed material or halogenated silane gasses) are separated one from another. The walls may completely or partially separate the beds and/or the areas above the beds from one another.

In certain embodiments, the reaction vessel includes one or more out-lets (66a, 66b, 66c, 66d, 66e, 66f). For instance, in certain embodiments, the reaction vessel (5) includes a plurality of outlets, at least one or two or more of which allow a gas constituent within the vessel to exit from the reaction vessel and/or to be recycled. As shown in FIG. 5, the outlets (66a, 66b, 66c and 66d) may be tubes that are included within the bed(s) and/or may be located at other places within the reaction vessel (66e, 66f).

In certain embodiments, the reaction vessel (5) is adapted to allow the deposition of silicon onto the surface (12) of a suitable substrate (10), while the substrate is fed into the reaction vessel (5), for instance, from another vessel, such as a fabrication vessel (not shown). For instance, in certain embodiments, the reaction vessel is a continuous feed reaction vessel, wherein the substrate (10) and/or one or more gas constituents (demarcated by arrows) are continuously fed into the reaction vessel (5) for a short or prolonged period of time.

For instance, as set forth in FIG. 5, a continuous feed reaction vessel (5) is provided, wherein an elongated substrate (10) is continuously fed into the reaction vessel (5), where in the reaction vessel (5), the surface (12) of the substrate (10) is coated with a doped silicon layer, such as an N doped and P doped silicon layer (72b and 74b, respectively). As can be seen with reference to FIG. 5, the substrate (10) is fed into the reaction vessel (5) from the left and travels to the right. Additionally, a reactant gas (e.g. a halide gas), which may include a carrier gas (e.g., Ar), may be fed into the reaction vessel (5) via a gas carrier assembly (80), which gas enters the various reaction zones (51, 52, 53 and/or 54) via openings in a distribution plate (90).

As the substrate (10) travels into and through the reaction vessel (5) the substrate (10) is first exposed to a reaction zone (51) that allows a gas, such as a silane, which contains an N type dopant, to be directed at the surface of the substrate. In this manner, a gas (demarcated by arrows), such as a halide gas, enters the reaction zone (51), via the gas carrier assembly (80) and the distribution plate (90), which gas contains silicon (e.g., a halosilane) that upon contact with the surface (12) of the substrate (10), coats the surface with an N doped silicon layer (72b).

As the substrate (10) continues to travel through the reaction vessel (5), the substrate is then exposed to a second reaction zone (52) that allows a gas, such as a silane, which contains P-type dopant, to be directed at the surface of the substrate. In this manner, a gas (demarcated by arrows), such as a halide gas, enters the reaction zone (52) via the gas carrier assembly (80) and the distribution plate (90), which gas contains silicon (e.g., a halosilane) that upon contact with the surface (12) of the substrate (10), that has been coated with N-type doped silicon layer (72b), coats the surface with a P doped silicon layer (74b).

As seen in FIG. 5, a third and fourth portion of the reaction vessel (5) includes an oxidation and anti-reflection zones (52 and 54, respectively) wherein the surface of the substrate (10) may then be oxidized and/or coated with an antireflection layer (76). The reaction vessel may also include a gas carrier assembly (80) and distribution plate (90) with gas inlets (82) that allow a suitable gas, e.g., a halide and/or Ar carrier gas, to enter the various reaction zones (51, 52, 53, and 54) of the reaction chambers or zones of the reaction vessel (5), so as to allow the surface of the substrate to be contacted with an appropriately doped silane containing gas that may be used to coat the surface of a substrate (e.g., a silicon containing substrate) with silicon.

Of course, a suitable reaction vessel may also include other various components deemed advantageous and/or useful for performing its designated function, which have not been set forth in the figures herein but are known in the art, such as those described in U.S. Pat. No. 5,855,678 to Sanjurjo et al., which reference is incorporated herein in its entirety. Other components may also be included such as a suitable heating device, electronic circuitry and/or a robotic movement apparatus that functions to move a substrate to and from, in and out, of the one or more reaction vessels.

Utility

The subject methods and compositions find use in a variety of applications. In accordance with the subject disclosure, the methods are useful for producing silicon containing substrates that have a wide array of technological uses. For instance, the silicon containing substrates produced in accordance with the methods of the subject invention may be used in silicon chips, e.g., in the production of integrated circuits, and/or as components in solar cells, flat panel displays, or the like.

A solar cell is a two-terminal electronic device which generates direct current across a load when the terminals of the device are connected to the load and the cell is illuminated by light of an appropriate wavelength. The solar cell converts a fraction of the incoming light to energy in a form of a current across the load. This energy may be used in a variety of manners, for instance, in the production of electricity.

Generally, a solar cell may be manufactured from a substrate, for example, a wafer or a portion of a ribbon, produced in accordance with the methods of the disclosure provided here in.

Specifically, in certain embodiments, polycrystalline silicon is deposited or grown atop a low-cost silicon containing substrate (which may be produced so as to include an intermedium diffusion barrier) so as to produce a silicon containing substrate that may be used in the manufacture of a solar cell. This polycrystalline silicon may be doped P or N-type, for instance, to produce a P or N-type doped substrate. A thin layer near the top of the deposited polycrystalline silicon may then be doped N-type or P-type, for example by diffusion of phosphorus into the deposited layer. In this manner a p-n or n-p junction may thus be formed in the deposited silicon on the substrate.

A p-n or n-p junction is a zone of the substrate or semiconductor doped with a P-type dopant adjacent to a zone of substrate or semiconductor doped with an N-type dopant. As provided herein the silicon to be deposited on the surface of the substrate may be doped in order to coat the substrate with one or more P or N-type doped silicon layers so as to establish a p-n junction and to create suitable contacts.

The deposited silicon may be patterned or textured in order to improve utilization of the impinging radiation. For instance, top contacts may be made, for example, in a grid pattern, and the bottom side of the substrate may be covered with a contact, for example, a contact made of aluminum, e.g., by evaporation and/or electroplating, as described above. The terminals of the device may be a conductive contact to the P-type zone and may be a conductive contact to the N-type zone. The conductive contacts may be metallic and may be produced on a fabricated substrate of the disclosure in accordance with methods of the fabrication arts.

For instance, the bottom side of the low-cost silicon substrate, provided in accordance with the methods disclosed herein, may be covered with a contact, for example made of aluminum by evaporation and/or printing and melting. A passivation layer, which may help for example to reduce surface recombination, may be deposited on top of the deposited silicon, or silicon oxide may be grown for passivation. An anti-reflection coating may also be deposited on the substrate, thereby producing a finished solar cell.

In a variant of the process described above, the deposited silicon may be doped n type during the deposition process and then a further process such as diffusion is used to cause a thin layer near the top of the deposited silicon to be doped P-type. Further, an n or p layer may be deposited, for example by controlling the flow of the dopant-containing gas during the process of silicon deposition. It may also be desirable to deposit an n+ or p+ layer in the low-cost silicon substrate. Such a layer may serve, for example, as a BSF. Additionally, the metallic or conductive layer may be deposited atop the low-cost silicon substrate, and that metallic or conductive layer may be used as a contact in lieu of covering the bottom side of the low-cost silicon substrate with a conductor.

The solar cells of the disclosure may be made from substrates that were produced by using a single-crystal or polycrystalline silicon wafer, which wafer may be sawed from silicon ingots, or may be produced from the consolidation of silicon fines. In either event, the solar cells thus produced are from substrates (e.g., silicon containing substrates) upon which silicon has been deposited and/or consolidated so as to generate a "thin film" for use in the manufacture of the solar cells.

Because the silicon to be used in the production of the solar cell has been deposited on the surface of a silicon substrate, in accordance with the methods of the disclosure, the silicon used for making the active regions of solar cells may be very pure. If the silicon used is polycrystalline, the crystalline domains may be large, with average domain diameters of at least about 10 µm, at least about 50 µm at least about 100 µm, at least about 150 µm, at least about 200 µm, or at least about 250 µm. In general, in solar cells of the disclosure, for instance, the thickness of the deposited silicon may be between about 25 µm and about 75 µm.

In some advanced solar cells, various processes are used to create trenches in the silicon to make better use of the incoming solar radiation. An example is described in U.S. Pat. No. 6,846,984, which is incorporated herein by reference. Such trenches may also be desirable in the processes of the disclosure.

Solar cells produced in accordance with the methods of the subject disclosure have a variety of uses, for example, to recharge the batteries of remotely-located electronic devices, which are not connected to the electrical grid. In this application, installing a solar cell system containing solar cells of the disclosure may be more cost effective than making an electrical grid connection to a remote location. Solar cells may also be connected through an inverter to the electrical grid, serving as electric power generators. It is also to be noted that substrates produced in accordance with the above described methods may also be used in the fabrication of displays, such as flat panel displays, which displays and their fabrication are known in the art.

All publications and patents cited in this specification are herein incorporated by reference as if each individual publication or patent were specifically and individually indicated to be incorporated by reference.

While the technology has been described with reference to the specific embodiments thereof, it should be understood by those skilled in the art that various changes may be made and equivalents may be substituted without departing from the true spirit and scope of the disclosure.

What is claimed is:

1. A method for depositing silicon (Si) on a surface of a substrate, comprising:
   providing a substrate wherein the substrate comprises a metallurgical grade silicon on which silicon (Si) is to be deposited;
   purifying a surface of the substrate;
   producing a diffusion barrier on the surface of the substrate that is purified;
   opening vias in the diffusion barrier on the surface of the substrate prior to depositing silicon thereon;
   providing one or more sources of gas, wherein at least one source of gas comprises a halide-containing gas;
   providing a reaction vessel comprising a silicon containing reaction bed, wherein said silicon containing reaction bed is between the substrate and the one or more sources of gas; and
   directing a gas from the one or more sources of gas into the silicon containing reaction bed at a temperature effective to release silicon in a form of a halogenated silane from the silicon containing reaction bed toward the substrate for deposition thereon.

2. The method according to claim 1, wherein the deposition of the silicon on the surface of the substrate further comprises at least one of: a chemical vapor deposition or a chemical vapor transport.

3. The method according to claim 1, wherein the metallurgical grade silicon substrate comprises a high temperature material that is inert with respect to Si.

4. The method according to claim 3, wherein the substrate comprises a same or a similar coefficient of thermal expansion as Si.

5. The method according to claim 1, wherein the substrate comprising the metallurgical grade silicon comprises at least one of: $SiO_2$, $Si_3N_4$, $SiON_2$, $LaF_3$, $CaF_2$, or mixtures thereof.

6. The method according to claim 1, wherein the substrate comprises from about 10% to about 100% silicon.

7. The method according to claim 1, wherein the substrate comprises silicon fabricated from an ingot, a wafer, a slab, a plate, a ribbon, or one or more silicon particles.

8. The method according to claim 1, wherein the substrate is conductive.

9. The method according to claim 1, wherein the purifying of the surface of the substrate comprises subjecting the substrate to a purification process.

10. The method according to claim 9, wherein the purification process comprises a process selected from at least one of: an advanced slagging process, exposing the surface to a thermodynamic sink, an oxidization of the surface, etching, or selective vaporization.

11. The method according to claim 10, wherein the purification process comprises said advanced slagging process, which results in a production of a substantially purified surface on the substrate.

12. The method according to claim 10, wherein the purification process results in a reduction in a concentration of impurities such that the surface of the substrate is from about 98.5% to about 99.999% pure.

13. The method according to claim 9, wherein the purification process takes place at a temperature ranging from about 1200° C. to about 1420° C.

14. The method according to claim 1, wherein the halide-containing gas comprises a halide selected from at least one of: chlorine, bromine, fluorine, or iodine.

15. The method according to claim 14, wherein the halide-containing gas further comprises a silane.

16. The method according to claim 15, wherein the gas comprises at least one of: chlorosilane, bromosilane, fluorosilane or iodosilane.

17. The method according to claim 1, wherein the silicon containing reaction bed comprises at least one of: a fixed bed, a moving bed, a fluid bed, a vibrating bed, a cascading bed, or a rotating bed.

18. The method according to claim 17, wherein the silicon in the silicon containing reaction bed comprises a silicon powder, a solid piece of silicon, a wafer of silicon, a porous body of silicon, or a briquette of silicon.

19. The method according to claim 18, wherein the silicon containing reaction bed comprises a fluidized bed and the silicon in the fluidized bed comprises a silicon powder comprising particles of silicon.

20. The method according to claim 19, wherein the gas contacts the silicon in the fluidized bed and thereby etches the silicon in the fluidized bed.

21. The method according to claim 20, wherein the etching results in an increase in activity of silanes in a gas phase.

22. The method according to claim 1, further comprising exposing the substrate to one or more dopants.

23. The method according to claim 22, wherein the silicon in the silicon containing reaction bed comprises the one or more dopants.

24. The method according to claim 22, wherein at least one of the one or more sources of gas comprises the one or more dopants.

25. The method according to claim 22, wherein the exposing of the substrate to the one or more dopants comprises chemical vapor deposition.

26. The method according to claim 22, wherein the exposing of the substrate with the one or more dopants comprises diffusion techniques.

27. The method according to claim 22, wherein the one or more dopants comprises a P type dopant.

28. The method according to claim 27, wherein the P-type dopant comprises at least one of: halides, boranes, diboranes, B-H species, $B_2H_6$, $BCl_3$, decaboranes, or mixtures thereof.

29. The method according to claim 22, wherein the exposing of the substrate with the one or more dopants results in a formation of a P layer.

30. The method according to claim 22, wherein the one or more dopants comprises an N-type dopant.

31. The method according to claim 30, wherein said N-type dopant comprises a Group V element or a volatile precursor thereof.

32. The method according to claim 31, wherein the N-type dopant comprises at least one of: P, Sb, $PCl_3$, $PCl_5$, $SbCl_5$, or mixtures thereof.

33. The method according to claim 22, wherein the exposing of the substrate with the one or more dopoants results in a formation of an N layer.

34. The method according to claim 22, wherein the exposing of the substrate to one or more dopants comprises sequentially exposing the substrate to both a P-type dopant and an N-type dopant.

35. The method according to claim 34, wherein the sequential exposing of the substrate to both said P-type dopant and said N-type dopant results in a production of a P layer and an N layer on the surface of the substrate.

36. The method according to claim 1, wherein the deposition of said Si onto the surface of the substrate results in a production of one or more Si nucleation centers.

37. The method according to claim 36, wherein the one or more Si nucleation centers comprise a plurality of Si nucleation centers, wherein the plurality of Si nucleation centers is spaced from about 1 micron to about 100 microns apart.

38. The method according to claim 36, further comprising contacting the one or more Si nucleation centers with a growth modifier.

39. The method according to claim 38, wherein the growth modifier is a metal.

40. The method according to claim 1, wherein the silicon within the silicon containing reaction bed comprises a temperature that ranges from about 200° C. to about 1400° C.

41. The method according to claim 40, wherein the substrate comprises a temperature that is above the temperature of the silicon in the silicon containing reaction bed.

42. The method according to claim 40, wherein the substrate comprises a temperature that is below the temperature of the silicon in the reaction bed.

43. The method according to claim 40, wherein heat is supplied to the reaction vessel by at least one of: resistance heating, induction heating, or an application of light.

44. The method according to claim 1, wherein the halogenated silane contacts the substrate and produces a thin film of silicon on the surface of the substrate.

45. The method according to claim 44, wherein the thin film comprises a layer of silicon that ranges from about 1 micron to about 200 microns thick.

46. The method according to claim 45, wherein said thin film comprises a layer of silicon that ranges from about 7 microns to about 35 microns.

47. The method according to claim 1, wherein the deposition occurs at a rate from about 1 micron per minute to about 30 microns per minute.

48. The method according to claim 47, wherein the deposition occurs at a rate from about 4 microns per minute to about 10 microns per minute.

49. A method for depositing silicon (Si) on a surface of a substrate, comprising:
   providing the substrate wherein the substrate comprises a metallurgical grade silicon on which silicon is to be deposited;
   purifying a surface of the substrate so as to produce a substantially purified surface;
   producing a diffusion barrier on the surface of the substrate that is substantially purified;

opening vias in the diffusion barrier on the surface of the substrate prior to depositing silicon thereon;
providing one or more sources of gas, wherein at least one source of gas comprises a silane containing gas; and
directing the silane containing gas from the at least one source of gas onto the purified surface of the substrate at a temperature effective for deposition of silicon thereon.

50. The method according to claim 49, wherein the deposition of the silicon on the surface of the substrate comprises at least one of: a chemical vapor deposition or a chemical vapor transport.

* * * * *